US009583660B2

(12) United States Patent
Karst et al.

(10) Patent No.: US 9,583,660 B2
(45) Date of Patent: Feb. 28, 2017

(54) METHOD FOR MANUFACTURING A PHOTOVOLTAIC MODULE WITH ANNEALING FOR FORMING A PHOTOVOLTAIC LAYER AND ELECTRICALLY CONDUCTING REGION

(71) Applicant: COMMISSARIAT A L'ENERGIE ATOMIQUE ET AUX ENERGIES ALTERNATIVES, Paris (FR)

(72) Inventors: Nicolas Karst, Folkling (FR); Sevak Amtablian, Lyons (FR); Simon Perraud, Bandol (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 14/371,224

(22) PCT Filed: Jan. 9, 2013

(86) PCT No.: PCT/IB2013/050167
§ 371 (c)(1),
(2) Date: Jul. 9, 2014

(87) PCT Pub. No.: WO2013/105024
PCT Pub. Date: Jul. 18, 2013

(65) Prior Publication Data
US 2015/0007866 A1    Jan. 8, 2015

(30) Foreign Application Priority Data

Jan. 11, 2012  (FR) .................................... 12 50291

(51) Int. Cl.
*H01L 31/0392*   (2006.01)
*H01L 31/046*    (2014.01)
(Continued)

(52) U.S. Cl.
CPC ...... *H01L 31/0516* (2013.01); *H01L 31/0322* (2013.01); *H01L 31/0324* (2013.01);
(Continued)

(58) Field of Classification Search
CPC . H01L 31/0516; H01L 31/1864; H01L 31/18;
H01L 31/0324; H01L 31/0322;
(Continued)

(56) References Cited

U.S. PATENT DOCUMENTS 5,578,503 A     11/1996 Karg et al.
2008/0105303 A1  5/2008 Oswald et al.
(Continued)

FOREIGN PATENT DOCUMENTS

EP        1 710 844        10/2006

OTHER PUBLICATIONS

Bartlome et al., "Laser applications in thin-film photovoltaics", Appl. Phys. B. (2010) 100: 427-436.
(Continued)

*Primary Examiner* — Christine Enad
(74) *Attorney, Agent, or Firm* — Clark & Brody

(57) ABSTRACT

The invention relates to a method for manufacturing a photovoltaic module comprising plurality of solar cells in a thin-layer structure, in which the following are formed consecutively in the structure: an electrode on the rear surface (41), a photovoltaic layer (43) obtained by depositing components including metal precursors and at least one element taken from Se and S and by annealing such as to convert said components into a semiconductor material, and another semiconductor layer (44) in order to create a pn junction with the photovoltaic layer (43); characterized in that the metal precursors form, on the electrode on the rear surface (41), a continuous layer, while said at least one element forms a layer having at least one break making it (Continued)

possible, at the end of the annealing step, to leave an area (430) of the layer of metal precursors in the metal state at said break.

5 Claims, 2 Drawing Sheets

(51) Int. Cl.
*H01L 31/05* (2014.01)
*H01L 31/032* (2006.01)
*H01L 31/0463* (2014.01)
*H01L 31/18* (2006.01)

(52) U.S. Cl.
CPC .......... *H01L 31/0463* (2014.12); *H01L 31/18* (2013.01); *H01L 31/1864* (2013.01); *Y02E 10/541* (2013.01)

(58) Field of Classification Search
CPC ... H01L 31/05; H01L 31/046; H01L 31/0392; H01L 31/0465
USPC .......................................................... 438/57
See application file for complete search history.

(56) References Cited

U.S. PATENT DOCUMENTS

| | | | |
|---|---|---|---|
| 2010/0000589 A1* | 1/2010 | Kiss | H01L 31/03923 136/244 |
| 2010/0170558 A1* | 7/2010 | Stein | H01L 31/0392 136/244 |
| 2010/0300526 A1 | 12/2010 | Denda et al. | |
| 2011/0207297 A1 | 8/2011 | Yaginuma et al. | |
| 2015/0020864 A1* | 1/2015 | Dufourcq | H01L 31/03923 136/244 |

OTHER PUBLICATIONS

Hermann et al., "Selective ablation . . . laser pulses", Applied Surface Science 252 (2006) 4814-4818.
Rekow et al., "Application of a . . . Micro-Processing Applications", NRC Publications Archive, Sep. 29, 2010.
Westin et al., "Laser Patterning of . . . CIGS PV modules", Solar Energy Materials & Solar Cells 92 (2008) 1230-1235.

\* cited by examiner

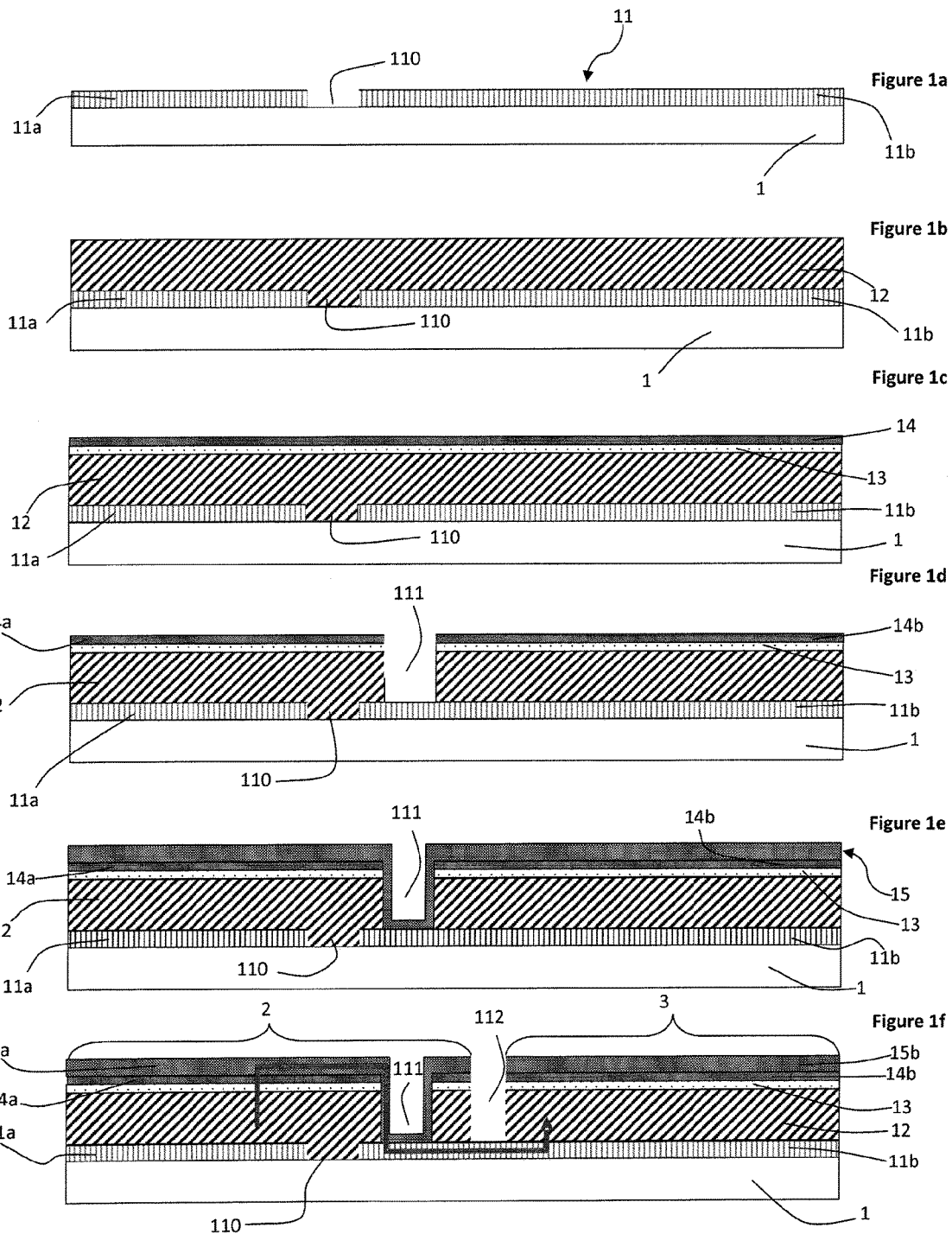

METHOD FOR MANUFACTURING A PHOTOVOLTAIC MODULE WITH ANNEALING FOR FORMING A PHOTOVOLTAIC LAYER AND ELECTRICALLY CONDUCTING REGION

FIELD ON THE INVENTION

The invention relates to the field of photovoltaic solar energy and more particular to thin film photovoltaic modules.

BACKGROUND ART

In the context of the present patent application, a "thin film" will be a film exhibiting a thickness of less than 5 µm.

A photovoltaic module comprises several solar cells placed in series. This is because the electric voltage generated at the terminals of just one solar cell, which is less than 1 volt, is generally too low for many devices. It is therefore necessary to place a large number of cells in series. Thus, the voltage delivered by a photovoltaic module is of the order of 100 volts, for approximately 100 cells connected in series.

For thin film photovoltaic modules, this placing in series can be obtained by etching and deposition stages carried out on one and the same substrate. A monolithic interconnection is thus produced. This exhibits a considerable advantage with respect to the conventional technology of bulk crystalline silicon. This is because the preparation of modules made of crystalline silicon requires profound and laborious wire connection and welding operations. All these operations are rendered unnecessary with the thin film technology.

The process for the monolithic interconnection of the thin film solar cells requires three etching stages, conventionally named P1, P2 and P3.

The first stage (P1) ensures electrical isolation of two adjacent cells at the rear-face electrode of the solar cells.

The second stage (P2) makes it possible to connect the front-face electrode of a given cell to the rear-face electrode of the adjacent cell.

The third stage (P3) consists in electrically isolating two adjacent cells at the front-face electrode.

Various techniques are employed to carry out this monolithic interconnection process.

The most conventional techniques are mechanical etching or laser ablation.

Reference may thus be made to the document U.S. Pat. No. 4,502,225, which describes a device comprising an etching tip intended for semiconducting devices.

The use of laser in thin film solar cells is described in particular in the papers "*Selective ablation of thin films with short and ultrashort laser pulses*", Hermann et al., Appl. Surf. Sci., 252 (2006), 4814, or also "*Laser applications in thin-film photovoltaics*", Bartolme et al., Appl Phys B, 100 (2010), 427-436.

These etching techniques exhibit the advantage of being able to be employed for a great variety of materials, deposited as thin films, such as, for example, CdTe, a-Si, CZTS (of general formula $Cu_2ZnSn(S, Se)_4$) or CIGS (of general formula $Cu(In, Ga) (S, Se)_2$).

However, these etching techniques each exhibit disadvantages.

Thus, mechanical etching results in damage to the materials as a result of the presence of mechanical stresses on the films, in the formation of debris on the surface of the films close to the etching line, which can result in short-circuiting problems, and in the wear of the etching tips. Furthermore, generally, the quality of the mechanical etching is very sensitive to many parameters, such as the morphology or the properties of the thin films, and also to the operating parameters of the etching tips.

Furthermore, laser ablation is not simple to carry out. This is because it would be found that the material withdrawn may melt and partially fill in again the groove produced by the laser ablation. Thus, this technique does not make it possible to obtain a clean surface necessary to produce an electrical contact of good quality.

Use may also be made of chemical etching methods. However, these methods are more complicated and more expensive to carry out than the conventional mechanical etching or laser ablation methods.

In order to put the invention better in context, a conventional monolithic interconnection process for a thin film photovoltaic module will now be described with reference to FIGS. 1a to 1f. All these figures are cross sectional views and represent different stages of the implementation of this process.

FIG. 1a represents a flexible or rigid substrate 1 which can be made of various materials, in particular of glass, or also of plastic or of metal (for example steel, aluminum or titanium).

Generally, this substrate is made of soda/lime glass, the thickness of which is a few millimeters and typically between 1 and 3 mm.

A molybdenum film 11, the thickness of which is generally between 100 nm and 2 µm and preferably of the order of 1 µm, is deposited on this substrate 1.

This molybdenum film will be used to form the rear-face electrode of the various cells forming the photovoltaic module.

FIG. 1a shows that an etching stage is carried out after the deposition of the Mo film. As indicated above, this etching is generally carried out either mechanically or by laser ablation. It results in the formation of a groove 110 devoid of molybdenum.

This groove 110 makes it possible to define the rear-face electrodes 11a and 11b of the adjacent cells 2 and 3 illustrated in FIG. 1f.

This etching stage corresponds to the stage P1 mentioned above.

The width of the groove 110 is generally between 10 µm and 100 µm and it is preferably of the order of 50 µm.

FIG. 1b illustrates another stage of the process in which a photovoltaic film and, by way of example, a crystalline CIGS film is produced. This film has a light-absorbing role.

This stage consists first of all in introducing, onto the rear-face electrode 11, Cu, In and Ga metal precursors and elements of Se and/or S type, used for the growth of the CIGS film, a p-type semiconducting material.

Numerous deposition processes suitable for thin films can be used.

They can be vacuum processes, such as evaporation or cathode sputtering, or processes carried out at atmospheric pressure, such as electrodeposition, screen printing, doctor blading, inkjet printing or slit coating.

Thus, Cu, In and Ga precursors can be deposited by cathode sputtering. An Se and/or S film can subsequently be deposited on the stack obtained by a vacuum method or a method carried out at atmospheric pressure.

Generally, a bulk contribution of S or Se is always necessary. The chalcogen S or Se can be introduced in the elemental gas form, in the gas form ($H_2S$ or $H_2Se$) or in the form of a film of evaporated S or Se deposited on the surface of the film of metal precursors.

It should be noted that the gases $H_2S$ and $H_2Se$ are highly toxic, which greatly complicates the use of these gases on the industrial scale.

The thickness of this film of metal precursors is generally between 300 nm and 1 µm.

The conversion of the constituents into a film 12 of crystalline CIGS is carried out by a high-temperature annealing, denoted selenization/sulfurization annealing, using a temperature rise gradient of between 1° C./s and 10° C./s.

Reference may in particular be made to the document U.S. Pat. No. 5,578,503, which describes a process for producing a semiconductor of the $CuXY_2$ type where X is In and/or Ga and Y is Se or S.

The temperature is generally between 400 and 600° C.

The film of constituents can be covered with a cap, preferably made of graphite. This cap makes it possible to ensure a greater Se and/or S partial pressure during the annealing, which results in the diffusion of Se and/or S into the metal precursors being increased.

FIG. 1c shows another stage of the implementation of the process, in which a film 13 of semiconductor of n type is deposited on the CIGS film, in order to form the pn junction.

This film can be deposited by a chemical bath, by cathode sputtering or also by evaporation.

It can, for example, be composed of CdS and be deposited by a chemical bath, the film 13 exhibiting a thickness of a few tens of nm.

Other materials can be used, such as ZnS or ZnOS, for a thickness, for example, of between 5 nm and 30 nm.

FIG. 1c also illustrates another stage of the process which is optional. This stage consists in depositing a film 14 of intrinsic ZnO, the role of which will be explained later.

This film 14 is highly transparent in the solar spectrum and highly resistive. It is generally deposited by cathode sputtering and exhibits a thickness of a few tens of nm.

It may be noted that the film 13 prevents reactions between the ZnO and the CIGS and thus protects the film 12 during the deposition of the film 14.

FIG. 1d illustrates a stage of implementation of the process in which another etching is carried out, either mechanically or by laser ablation.

This etching, corresponding to abovementioned stage P2, consists in removing all the films deposited beforehand on the molybdenum film 11. This etching thus makes it possible to produce an opening referenced 111 in FIG. 1d. It will make it possible to produce a portion of the electrical interconnection between two adjacent cells.

The width of the opening 111 is generally between 50 µm and 150 µm and it is preferably equal to approximately 100 µm.

Furthermore, the distance between the openings 110 and 111 is generally between 50 µm and 150 µm and it is preferably equal to approximately 100 µm.

FIG. 1e illustrates yet another stage of implementation of the process, in which a film of a conducting transparent oxide 15 is deposited.

This film can be deposited by cathode sputtering and can exhibit a thickness of a few tens of nm.

It can in particular be Al-doped ZnO, exhibiting a thickness of approximately 500 nm.

This Al-doped ZnO film will be used to form a conducting transparent electrode referenced 15a for the front-face electrode of the cell 2 and 15b for the front-face electrode of the cell 3 (see FIG. 1f).

It is generally accepted that the film 13 of semiconductor of n type may exhibit discontinuities. The ZnO film 14 then has the role of ensuring electrical isolation between the conducting film 15 and the CIGS film 12.

Other materials, such as tin-doped indium oxide (ITO), silver nanowires or carbon nanotubes, might also be employed to produce this conducting transparent electrode. Likewise, other deposition techniques might also be used.

It is understood that the distance between the openings 110 and 111 has to be sufficiently high to prevent an excessively high interconnection resistance between the front-face electrode 15a of the cell 2 and the rear-face electrode 11b of the cell 3.

FIG. 1f illustrates a final stage of the process, in which another etching is carried out in the stack of films in order to definitively isolate the cell 2 from the cell 3.

This etching stage corresponds to the abovementioned stage P3. It can be carried out mechanically or by laser ablation and consists in removing all the films deposited on the rear-face electrode 11b.

The opening 112 obtained makes it possible to electrically isolate the two cells 2 and 3 at their front-face electrodes 15a and 15b.

The opening 112 more generally exhibits a width of between 10 µm and 200 µm and it is preferably of the order of 100 µm.

FIG. 1f also illustrates the pathway of the charges between the two adjacent cells 2 and 3.

Thus, the front-face electrode 15a of the first cell 2 makes it possible to collect, on the front face, the electric charges generated in this cell 2 and to convey them to the rear-face electrode 11b of the adjacent cell 3.

Due to the disadvantages exhibited by the conventional etching techniques, solutions have been provided in the state of the art.

They concern the stage P2 and they have the object of locally increasing the conductivity of the CIGS material in order to bring about the conduction of the charges from the front-face electrode of a given cell to the rear-face electrode of the adjacent cell.

It can be a laser treatment which makes it possible to locally bestow the metallic behavior on the CIGS. Reference may in particular be made to the paper by Westin et al., "Laser patterning of P2 interconnect via thin-film CIGS PV modules", Solar Energy Materials and Solar Cells, 92 (2008), 1230.

Thus, the laser treatment makes it possible to create a region of greater conductivity than the remainder of the CIGS film which replaces the direct contact between the Al-doped ZnO film and the rear-face molybdenum electrode.

However, the lasers which can render the CIGS conducting are different from those used to etch it, during the P3 stage. Reference may in particular be made to the paper *"Application of a Pulse Programmable Fiber Laser to a Broad Range of Micro-Processing Applications"*, Rekow et al., NRC Publications Archives. Thus, two types of laser are then necessary, which considerably increases the production costs.

Metal precursors deposited locally on the rear-face electrode can also play this role by diffusing into the CIGS film during the growth of the latter at high temperature. Reference may in particular be made, in this regard, to the document US-2010/0000589.

However, this technique also exhibits disadvantages. This is because it requires first of all the addition of a supplementary stage of deposition of strips of doping elements, in comparison with the conventional monolithic interconnection processes. This renders the process more complex and increases the production cost.

Furthermore, the diffusion of the doping elements within the CIGS results locally in the formation of a modified semiconductor which exhibits a greater conductivity than the CIGS but a lower conductivity than that of a metal. Thus, the electrical connection between the front-face electrode of one cell and the rear-face electrode of the adjacent cell will be made through a modified semiconductor, the resistance of which is greater than that of a metal. The electrical connection will thus be of poorer quality than that which can be obtained by a conventional interconnection process since, in this case, the electrical connection is made through a conducting and transparent electrode in direct contact with the metal molybdenum electrode.

SUMMARY OF THE INVENTION

It is an object of the invention to overcome the disadvantages of the state of the art by providing another process which makes it possible to ensure the electrical contact between the front-face electrode of a solar cell and the rear-face electrode of the adjacent cell without requiring an additional stage, whether this is an etching, laser treatment or specific deposition stage, this electrical contact furthermore being of good quality.

Thus, the invention relates to a process for producing a photovoltaic module comprising a plurality of solar cells in a thin film structure, in which the following are successively produced in the structure: a rear-face electrode, a photovoltaic film obtained by deposition of constituents comprising metal precursors and at least one element taken from Se and S and, by annealing, to convert these constituents into a semiconducting material, and another semiconducting film, in order to create a pn junction with the photovoltaic film.

BRIEF DESCRIPTION OF THE DRAWINGS

FIGS. 1a to 1f illustrate a series of stages to make a monolithic interconnection for a thin film photovoltaic module.

DETAILED DESCRIPTION OF THE INVENTION

According to the invention, the metal precursors form, on the rear-face electrode, a continuous film, whereas said at least one element forms a film exhibiting at least one discontinuity, making it possible, on conclusion of the annealing, to leave a region of the film of metal precursors in the metal state at said discontinuity.

The process thus makes it possible to avoid the etching stage P2 which is provided in conventional interconnection processes.

In a first embodiment, said at least one element is deposited in localized fashion.

Preferably, the metal precursors are of the Cu, Ga and In or Cu, Zn and Sn type.

The annealing is advantageously carried out at a temperature of between 400 and 600° C. and preferably of the order of 550° C.

Advantageously, the other semiconducting film exhibits a discontinuity at said region.

The invention also relates to a photovoltaic module comprising a plurality of solar cells connected in series on a common substrate, each cell comprising a front-face electrode which is transparent to light and a rear-face electrode, separated from the front-face electrode by a photovoltaic film and another semiconducting film which makes it possible to create a pn junction.

According to the invention, the front-face electrode of a cell is connected electrically to the rear-face electrode of the adjacent cell via a region of the photovoltaic film which is composed of metal precursors.

As this module does not comprise etching of P2 type, it exhibits, between two adjacent cells, only a single opening resulting from a stage of P3 etching emerging on the substrate.

The electrical connection between the front-face electrode of a cell and the rear-face electrode of the adjacent cell is additionally of good quality.

Furthermore, the other semiconducting film advantageously exhibits a discontinuity at the metal region of the photovoltaic film.

The photovoltaic film is advantageously made of CIGS or of CZTS.

Figure 2A:
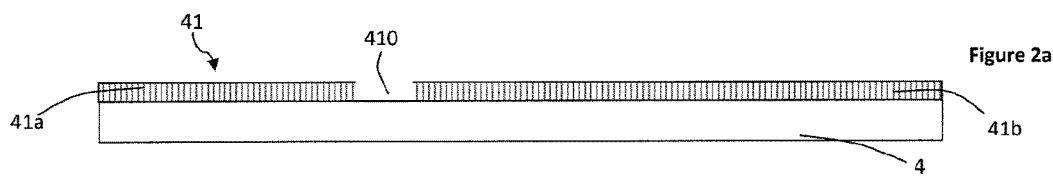
FIGS. 2a to 2e illustrate a series of stages to make a monolithic interconnection for a thin film photovoltaic module according to one embodiment of the invention.
Figure 2B:
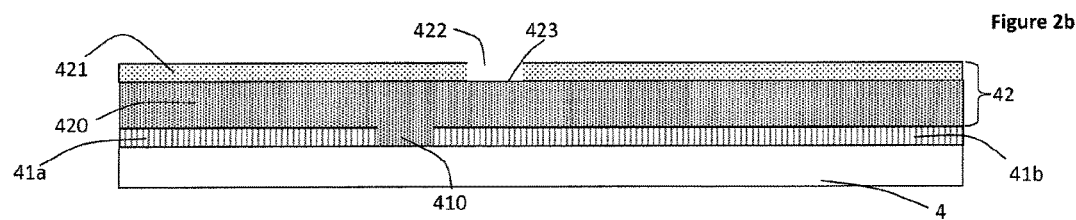
Figure 2C:
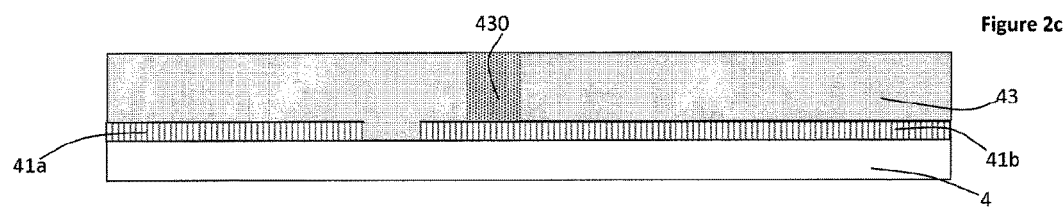
Figure 2D:
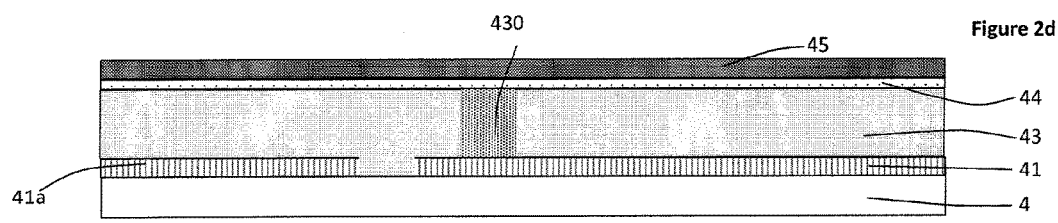
Figure 2E:
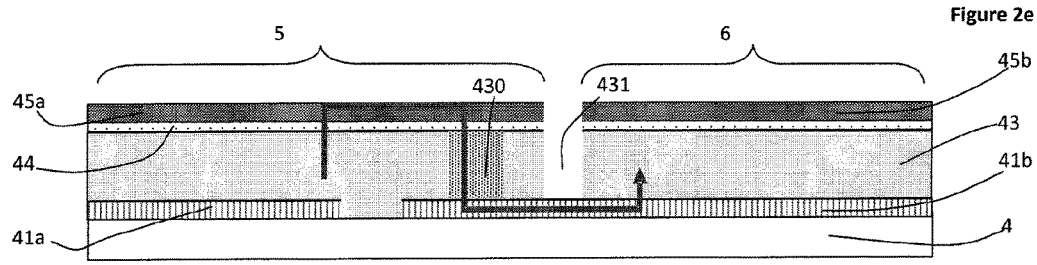
Figure 3:
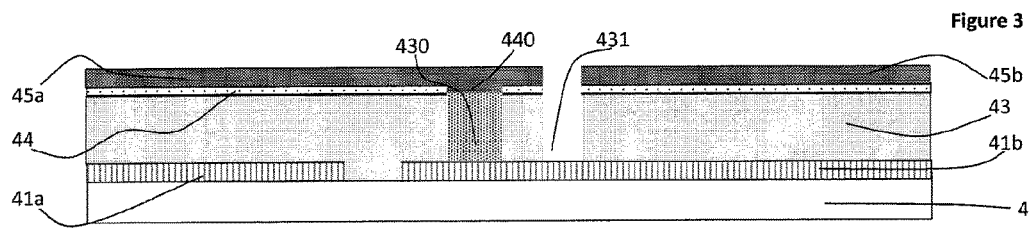
FIG. 3 shows another embodiment of the invention wherein the thin film has discontinuities.

A better understanding of the invention will be obtained and other aims, characteristics and advantages of the invention will become more clearly apparent on reading the description which follows and which is made with regard to the appended figures, in which:

FIGS. 2a to 2e are cross sectional views which represent different stages of the process according to the invention and FIG. 3 is also a cross sectional view which represents an alternative form of the process according to the invention.

FIG. 2a represents a substrate 4, which can be made of various materials, conventionally of glass, of plastic or of metal, covered with a thin isolating film. Generally this substrate is made of soda/lime glass, the thickness of which is a few millimeters and, for example, 3 mm.

A metal film 41 is deposited on this substrate 4, which film forms a rear-face electrode for the various cells of the photovoltaic module which will be obtained by the process according to the invention. This film is made, for example, of molybdenum and its thickness is between 100 nm and 2 μm and in particular equal to approximately 1 μm.

The deposition of the molybdenum film can in particular be carried by cathode sputtering.

It should be pointed out that the film 41 can also be made of a semiconductor material, such as ITO, or of a nitride-based conducting material, such as ZrN or TiN.

FIG. 2a shows that an etching stage is carried out after the deposition of the film 41. As indicated above, this etching is generally carried out either mechanically or by laser ablation. It results in the formation of a groove 410, which is thus devoid of metal.

This groove 410 makes it possible to define the rear-face electrodes 41a and 41b of the adjacent cells 5 and 6 illustrated in FIG. 2e.

This etching stage corresponds to the abovementioned stage P1.

The width of this groove 410 is generally between 10 and 100 μm and it is preferably of the order of 50 μm.

FIG. 2b illustrates the stage of the process in which the film 42, comprising the constituents which will result in the formation of the photovoltaic film, is produced.

This film 42 comprises a film 420 of metal precursors, for example Cu, Ga and In, and a film 421, for example of selenium.

The metal precursors can be deposited on the film 41 by printing or cathode sputtering methods.

These precursors can be deposited in the elemental form, that is to say in the form of Cu, Ga and In, according to successive films. They can also be deposited simultaneously in the form of alloys, for example CuGa, CuIn or InGa.

Preferably and with these same examples of constituents, the metal precursors are deposited in the form of at least two films, with a first film composed of the CuGa alloy and a second film composed of indium.

In this case, the homogeneity of the film of metal precursors can be improved by carrying out an alternating deposition of fine CuGa and indium films. These films can in particular exhibit a thickness of approximately 50 nm, the deposition of successive films being carried out until the thickness desired for the film 420 is obtained.

This thickness is generally between 300 nm and 1 μm and it is preferably equal to 750 nm.

Still in the example under consideration, the metal precursors are preferably deposited so that the following ratios are observed:

$$0.75 \leq Cu/(In+Ga) \leq 0.95;\ 0.55 \leq In/(In+Ga) \leq 0.85\ \text{and}\ 0.15 \leq Ga/(In+Ga) \leq 0.45.$$

These ratios are conventionally chosen in order to retain the electrical and optical properties desired for this type of semiconductor.

The selenium film 421 is subsequently deposited, for example via vacuum evaporation, on the film 420.

As illustrated in FIG. 2b, this film 421 is not continuous. On the contrary, it exhibits a discontinuity 422. In other words, the film 420 of metal precursors is devoid of selenium in the region 423 left free.

In order to avoid short circuits, the distance between the discontinuity 422 and the etching 410 will advantageously be between 50 and 150 μm and preferably of the order of 100 μm.

This discontinuity in the film 421 can be obtained by different processes.

First of all, the deposition of selenium can be carried out in localized fashion by carrying out a vacuum evaporation through a mask.

This mask can, for example, exhibit the following characteristics: be made of electrodeposited nickel and comprise one or more slits (the number of slits depending on the number of photovoltaic cells provided in the module to be produced), each slit exhibiting a width of between 50 and 150 μm and preferably equal to substantially 100 μm.

The film 421 can also be deposited by printing methods (screen printing or inkjet printing, for example), using in particular an ink based on selenium nanoparticles dispersed in an organic solvent. This process exhibits the advantage of being less expensive as the printing methods can be carried out at atmospheric pressure.

Furthermore, the thickness of the film 421 depends on the thickness of the film 420 of metal precursors.

By way of example, for a film 420, the thickness of which is between 500 nm and 1 μm, the selenium film 421 will exhibit a thickness of between 1 and 2 μm. Furthermore, for a film 420 exhibiting a thickness of 775 nm, the selenium film 421 will exhibit a thickness of 1.5 μm. This is because it is necessary to observe an excess Se stoichiometry of approximately 40%, it being known that the theoretical stoichiometry of the $Cu(In, Ga)Se_2$ is such that Se/Cu=2. It is the same when the metal precursors chosen result in the formation of CZTS.

FIG. 2c illustrates another stage of the process in which the film of constituents 42 is converted into a film of semiconductor material 43.

The conversion is carried out conventionally by a high temperature annealing carried out under a neutral atmosphere, for example of nitrogen or argon.

This annealing can be carried out at a temperature of between 400 and 600° C. and preferably at a temperature of approximately 550° C.

The duration of the annealing is generally between 30 s and 5 min and it is preferably of a duration of approximately 1 min.

Once the annealing has been carried out, the metal precursors and the selenium react to form a film of CIGS semiconductor 43 which is localized.

This is because, in the region 423, the metal precursors were not in contact with the selenium and they will thus remain in metallic form.

The region of the film 43 in which the precursors remain in metallic form is identified by the reference 430 in FIG. 2c.

In this region 430 and as a function of the annealing temperature, the metal precursors will be in the form of InGa alloy, CuGA alloy, CuIn alloy, elemental indium, elemental Ga or elemental Cu, or also a mixture of a portion or all of these elements.

It should be noted that, during the annealing, a portion of the selenium also diffuses close to the discontinuity 422 and thus reacts with the metal precursors present in the film 420, at the region 423. Consequently, the width of the region 430 is less than the width of the opening 422.

By way of example, under annealing conditions such that the temperature rise gradient is 10° C./s with a maximum at 550° C. for 1 min and at an argon pressure of 900 mbar, and with a thickness of the selenium film 421 of 1.5 μm, the width of the region 430 will be of the order of 85 μm for an opening 422 with a width of 100 μm.

Generally, it is found that, the greater the thickness of the selenium film, the smaller the width of the metal region 430.

Likewise, the greater the duration of the annealing, the smaller the width of the region 430.

This metal region 430 will make it possible to ensure the electrical connection between the front-face electrode of a cell of the photovoltaic module with the rear-face electrode of the adjacent cell, without it being necessary to carry out a stage of etching in the photovoltaic film, which etching corresponds to the stage P2 according to the state of the art.

Generally, the width of the region 430 will be between 50 and 150 μm, whereas the width of the discontinuity 422 will be between 60 and 160 μm.

FIGS. 2d and 2e describe the other stages of the process according to the invention, which are similar to those described with reference to FIGS. 1c, 1e and 1f.

Thus, with reference to FIG. 2d, a film 44 of n-type semiconductor is deposited on the film 46, in order to form the pn junction. As indicated from the viewpoint of FIG. 1c, the material used can be CdS, ZnS or ZnOS, in particular deposited with a chemical bath.

FIG. 2d illustrates another stage of the process which consists in depositing a film of a transparent and conducting oxide 45 on the film 44.

It may be noted that an intermediate ZnO film can be deposited between the films 44 and 45. This intermediate film is optional. Its role has been described above with reference to FIG. 1e.

This film 45 can be composed of Al-doped ZnO, this film being deposited by cathode sputtering.

The thickness of the film 45 is between 100 and 800 nm and preferably equal to approximately 500 nm.

Finally, FIG. 2e illustrates a final stage of the process, in which another etching is carried out in the stack of films.

This etching stage corresponds to the stage P3.

The opening 431 obtained makes it possible to define two adjacent cells 5 and 6 and to isolate them electrically, at their front-face electrodes 45a and 45b.

Generally, the information given for the implementation of the stages illustrated in FIGS. 1c, 1e and 1f is also valid for the stages illustrated from the viewpoint of FIGS. 2d and 2e.

FIG. 2e also illustrates the pathway of the charges between two adjacent cells 5 and 6.

Thus, the front-face electrode 45a of the first cell 5 makes it possible to collect, on the front face, the electric charges generated in this cell 5 and convey them to the rear-face electrode 41b of the adjacent cell 6, through the metal region 430 of the film 43.

While on this subject, it should be noted that the thickness of the film 44 is sufficiently small to allow the electric charges to pass from the electrode 45a to the region 430.

Generally, the thickness of the film 44 is less than 100 nm and it is preferably of the order of 10 nm.

Thus, the process which has just been described exhibits the advantage of eliminating one of the etching stages conventionally provided in monolithic interconnection processes, in this case the stage P2, and thus to be freed from the disadvantages related to this etching stage.

As an alternative form, the selenium film 421 can be replaced by a film of sulfur or of a mixture of sulfur and selenium.

The sulfur can be deposited on the film 420 by the same deposition processes as those mentioned above for the selenium.

However, in order to deposit a mixture of sulfur and selenium, it will be possible to use a printing method, such as inkjet printing, starting from ink based on sulfur and selenium.

The deposition of sulfur and selenium can also be carried out under vacuum while alternating the selenium film or films and the sulfur film or films in order to obtain a distribution according to an S/Se bilayer or an S/Se multilayer, the sulfur and the selenium being alternated. The formation of a multilayer makes it possible to improve the distribution of the two components. Thus, the annealing will then result in the formation of $Cu(In, Ga)(S, Se)_2$.

The metal constituents forming the film 420 can also be of the Cu, Zn and Sn type.

The metal precursors are preferably deposited so that the following ratios are observed:

$0.75 \leq Cu/(Zn+Sn) \leq 0.95$ and $1.05 \leq Zn/Sn \leq 1.35$.

The process according to the invention then results in solar cells being obtained, the photovoltaic film of which is made of a material of the CZTS type and in particular $Cu_2ZnSnSe_4$, $Cu_2ZnSnS_4$ or $Cu_2ZnSn(S, Se)_4$, according to whether the film 421 comprises selenium, sulfur or a mixture of the two components.

Germanium can also be incorporated in the unit cell of the CZTS to form a material of the $Cu_2Zn(Sn, Ge)(S, Se)_4$ type, when the film 421 comprises a mixture of selenium and sulfur.

The metal constituents forming the film 420 can also be of the Cu, Al and In type.

The process according to the invention then results in solar cells being obtained, the photovoltaic film of which is made of a material of the $Cu(In, Al)(S, Se)_2$ type.

Another alternative embodiment of the process is described with reference to FIG. 3.

FIG. 3 shows that the film 44, in particular made of ZnOS, is not deposited continuously over the photovoltaic film 43. On the contrary, the film 44 comprises discontinuities 440 at the regions 430 of the photovoltaic film 43.

This localized deposition can, for example, be carried out by inkjet printing. It exhibits the advantage, in comparison with the embodiment illustrated in FIG. 2e, of avoiding the addition of a resistance which would originate from the presence of the film 44 between the electrode 45a and the region 430.

The sole aim of the reference signs inserted after the technical characteristics appearing in the claims is to facilitate understanding of the latter and should not limit the scope thereof.

The invention claimed is:

1. A process for producing a photovoltaic module comprising a plurality of solar cells in a thin film structure, in which the following are successively produced in the structure: a rear-face electrode (41), a photovoltaic film (43) obtained by deposition of constituents comprising metal precursors and at least one element taken from Se and S and, by annealing, to convert these constituents into a semiconducting material, and another semiconducting film (44), in order to create a pn junction with the photovoltaic film (43), characterized in that the metal precursors form, on the rear-face electrode (41), a continuous film (420), whereas said at least one element forms a film (421) exhibiting at least one discontinuity (422), making it possible, on conclusion of the annealing, to leave a region (430) of the film (420) of metal precursors in the metal state at said discontinuity, said process further comprising:

depositing said at least one element of S and Se to form the film (421) on the layer of metal precursors (420), the film (421) of the at least one element of S and Se is deposited so as to form the at least one discontinuity forming an opening (422) so that the film of precursors (420) is devoid of said at least one element of S and Se in a left free region (423) facing the opening (422), under the annealing, the metal precursors contained in the film of precursors (420) react with said at least one element of S and Se contained in the film (421) to form said photovoltaic film (43) and the metallic precursors of said film of precursors (420) at said left free region (423) remain in metallic form by being not in contact with the at least one element of S and Se and thereby form an electrically conducting region (430) through the photovoltaic film (43).

2. The process as claimed in claim 1, characterized in that the film (421) of said at least one element is deposited in localized fashion.

3. The process as claimed in claim 1, characterized in that the metal precursors are of the Cu, Ga and In or Cu, Zn and Sn type.

4. The process as claimed in claim 1, characterized in that the annealing is carried out at a temperature of between 400 and 600° C. and preferably of the order of 550° C.

5. The process as claimed in claim 1, characterized in that the other semiconducting film (44) exhibits a discontinuity (440) at said region (430).

* * * * *